United States Patent
Bastistella et al.

(10) Patent No.: US 12,342,511 B2
(45) Date of Patent: Jun. 24, 2025

(54) PLASTIC COVER FOR CLOSING A FLUID-BASED COOLING CIRCUIT FOR AN ITEM OF ELECTRICAL EQUIPMENT

(71) Applicant: Valeo Siemens eAutomotive France SAS, Cergy (FR)

(72) Inventors: Rudy Bastistella, Herblay (FR); Aurélien Pouilly, Poissy (FR); Aymeric Fouque, Cergy (FR); Emmanuel Talon, Cergy (FR); Pierre Smal, Cergy (FR); Grégory Hodedourg, Cergy (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 121 days.

(21) Appl. No.: 17/640,535

(22) PCT Filed: Aug. 31, 2020

(86) PCT No.: PCT/EP2020/074243
§ 371 (c)(1),
(2) Date: Mar. 4, 2022

(87) PCT Pub. No.: WO2021/043725
PCT Pub. Date: Mar. 11, 2021

(65) Prior Publication Data
US 2022/0338391 A1    Oct. 20, 2022

(30) Foreign Application Priority Data
Sep. 6, 2019 (FR) ........................ 1909842

(51) Int. Cl.
*H05K 7/20* (2006.01)

(52) U.S. Cl.
CPC ...... *H05K 7/20927* (2013.01); *H05K 7/20272* (2013.01)

(58) Field of Classification Search
CPC ........... H05K 7/20272; H05K 7/20927; H05K 7/20872; H05K 7/2089; H05K 7/20845
See application file for complete search history.

(56) References Cited

U.S. PATENT DOCUMENTS 5,841,634 A   11/1998  Visser
7,291,036 B1* 11/2007  Daily .................... H02S 40/345
                                                        439/76.1
(Continued)

FOREIGN PATENT DOCUMENTS

CN    104334003 A    2/2015
DE    102007022517 A1  11/2008
(Continued)

OTHER PUBLICATIONS

DE-102018206944-A1 Translation.*
(Continued)

*Primary Examiner* — Jayprakash N Gandhi
*Assistant Examiner* — Matthew Sinclair Muir
(74) *Attorney, Agent, or Firm* — Osha Bergman Watanabe & Burton LLP

(57) ABSTRACT

The present invention relates to a closure cover (10) for closing a fluid-based cooling circuit for an item of electrical equipment (30), notably of a motor vehicle, said closure cover (10) being made of plastic and being configured to close, by covering it, a coolant circulation duct (130) of said cooling circuit.

10 Claims, 3 Drawing Sheets

(56) References Cited

U.S. PATENT DOCUMENTS

| | | | |
|---|---|---|---|
| 7,729,117 B2 * | 6/2010 | Schweinbenz | H05K 7/20872 165/104.19 |
| 9,151,814 B2 * | 10/2015 | Albrecht | G01R 33/3614 |
| 9,172,218 B2 * | 10/2015 | Kamigaichi | H02G 3/081 |
| 9,192,083 B2 * | 11/2015 | Moon | H05K 9/0007 |
| 10,369,497 B2 * | 8/2019 | Nakai | B01D 21/2483 |
| 2004/0190318 A1 * | 9/2004 | Tsuchiya | H05K 7/20927 363/141 |
| 2004/0257757 A1 | 12/2004 | Schweinbenz et al. | |
| 2006/0254755 A1 * | 11/2006 | Chen | H01L 23/427 165/104.33 |
| 2010/0187680 A1 * | 7/2010 | Otsuka | H01L 23/3735 257/E23.103 |
| 2013/0207459 A1 * | 8/2013 | Schroder | H01M 50/264 307/10.1 |
| 2016/0021796 A1 | 1/2016 | Vögerl et al. | |
| 2017/0181332 A1 | 6/2017 | Schmitt | |
| 2018/0023568 A1 * | 1/2018 | Kang | F04C 23/008 361/689 |
| 2018/0245862 A1 * | 8/2018 | Bungo | F28F 3/086 |
| 2019/0252971 A1 * | 8/2019 | Kim | H05K 7/14 |

FOREIGN PATENT DOCUMENTS

| | | |
|---|---|---|
| DE | 102018206944 A1 * | 11/2019 |
| EP | 2179895 B1 | 9/2011 |
| EP | 2645839 A2 | 10/2013 |
| KR | 20180049868 A | 5/2018 |

OTHER PUBLICATIONS

International Search Report and Written Opinion in corresponding International Application No. PCT/EP2020/074243, dated Dec. 16, 2020 (20 pages).

Office Action issued in corresponding CN Application No. 202080069238.3, dated Dec. 4, 2024 (12 Pages with English Translation).

Office Action Issued in Corresponding EP Office Action No. 20761296.1 dated Nov. 20, 2024 (10 Pages).

* cited by examiner

PLASTIC COVER FOR CLOSING A FLUID-BASED COOLING CIRCUIT FOR AN ITEM OF ELECTRICAL EQUIPMENT

TECHNICAL FIELD

The present invention relates to the field of electrical equipment, notably for vehicles, particularly for electric or hybrid vehicles. More specifically, the present invention targets a cover of a fluid-based cooling circuit for an item of electrical equipment, notably for a DC/DC converter, an electric charger or an inverter, particularly for a vehicle.

PRIOR ART

In an item of electrical equipment, notably a DC/DC converter, an inverter or an electric charger (otherwise known as an "OBC" which stands for On-Board Charger), certain electrical components are cooled by circulating a coolant, for example a mixture of water and of glycol, or even oil, in a cooling circuit formed in part of the case of the electrical equipment. The cooling circuit is generally configured to route the coolant close to the electrical components or other elements to be cooled, such as electronic boards for example.

The cooling circuit is closed by a closure cover. These days, the case and the closure cover, notably for a DC/DC converter, an electric charger or an inverter, particularly for a vehicle, are usually made of aluminum.

In particular, such a cooling circuit may be formed from two complementing parts. In that case, for example, a case and a cover of an item of electrical equipment comprise complementing cooling circuit portions. Said complementing portions comprise ducts, recessed parts or projecting parts, so that the cooling circuit obtained by assembly may notably extend "three dimensionally", insofar as the path followed by the coolant experiences changes in direction in three non-coplanar directions. In other words, the circulation duct then comprises successive stages at different levels.

Spigots are also provided to form coolant inlets/outlets in the cooling circuit. The English term "spigot" is well known to those skilled in the art. This term refers to a faucet or a tube, or more generally a fluid end-piece, generally male, that allows fluid to pass and that forms an inlet or an outlet of a circuit integrated into a casing. Generally associated with a sealing gasket, spigots thus allow a fluid to enter or leave a circuit integrated into a case of an item of electrical equipment. Thus, here, the term "spigot" corresponds to a "fluid end-piece" allowing the cooling circuit to be coupled to pipes conveying the coolant. Sealing at the junction between the water end-pieces and said pipes may be achieved in a variety of ways, either through the use of seals, or by clamping a collar onto the pipe around said water end-piece.

In the prior art, the spigots are distinct mechanical elements fixed to the case in the continuity of ducts giving onto the cooling circuit, to form coolant inlets/outlets. These spigots collaborate with seals at the interface between the inside of the cooling circuit and the outside of the case in which they are formed, in order to provide sealing for the electrical equipment.

It must be specified that the assembly operates in an environment in which the temperatures reach notably −40° C. or else +105° C. and the coolant flow rates are high, notably in excess of 8 l/s. The voltages may notably exceed 400 V and the current strengths exceed 800 A. The temperatures of the coolant are notably comprised in a range from −40° C. to +80° C. In such an environment, the fluid circulation ducts of the cooling circuit need to maintain their shape factor, something which is made more complicated by the demands placed upon them in terms of temperature and in terms of mechanical stresses. Given the coolant flow rates employed, sealing is also difficult to guarantee.

In this context, the invention targets the use of a closure cover for closing a cooling circuit of an item of electrical equipment which is made of plastic, obtained by molding, the case of the electrical equipment, in which case the fluid-based cooling circuit is formed, being made of another material, notably of aluminum or of cast iron.

In particular, the spigots can be molded together with or overmolded with the plastic closure cover.

PRESENTATION OF THE INVENTION

More specifically, one subject matter of the invention is a closure cover for closing a fluid-based cooling circuit for an item of electrical equipment, notably of a motor vehicle, said closure cover being made of plastic and being configured to close, by covering it, a coolant circulation duct of said cooling circuit.

The present invention notably makes it possible to produce a closure cover that is less expensive, being obtained by a process of injection molding a plastic rather than a process of injection molding aluminum, in particular. The closure cover according to the invention is also more lightweight and, depending on the embodiment chosen, is able to fulfill a number of functions—sealing, coolant inlet/outlet, etc.—by means of a reduced number of components, notably by means of a single component, namely said closure cover.

According to one embodiment, said closure cover features a water-side face and an opposite face, the opposite face featuring an arrangement of ribs which are configured to mechanically reinforce portions of the cooling circuit.

According to one embodiment, said closure cover features a thickness which is defined as a function of ranges of values predefined respectively for the pressure and for the temperature of the coolant intended to circulate in the coolant circulation duct.

According to one embodiment, said ribs feature a thickness of between 0.3 times and 1 times the thickness of the closure cover.

According to one embodiment, portions of the closure cover which are intended to be mechanically fixed to the case, on either side of the coolant circulation duct, are connected by first ribs, second ribs substantially transverse to said first ribs connecting said first ribs to a border of the closure cover on each side of said first ribs respectively.

According to one embodiment, the closure cover further incorporates at least one coolant inlet and/or outlet fluid end-piece.

According to one embodiment, said at least one coolant inlet and/or outlet fluid end-piece is molded in the mass of the closure cover, forming a single component that is homogenous in terms of material.

According to one embodiment, said at least one coolant inlet or outlet fluid end-piece is formed of a mechanical element, notably made of metal, incorporated into the closure cover by overmolding.

According to one embodiment, the closure cover further comprises at least two coolant inlet and/or outlet fluid end-pieces including a cooling circuit coolant inlet end-piece and a cooling circuit coolant outlet end-piece.

According to one embodiment, the closure cover further comprises at least a metal insert including at least a plate acting as a heat sink or at least a threaded hollow barrel intended to accept a fixing screw for fixing the closure cover.

The invention is also aimed at an item of electrical equipment, comprising a case, notably made of aluminum or of cast iron, within the mass of which there is formed a coolant circulation duct forming a fluid-based cooling circuit, said item of electrical equipment comprising a closure cover for closing the fluid-based coolant circuit as briefly described hereinabove.

According to one embodiment, said item of electrical equipment is a DC/DC voltage converter or an inverter or an electric charger.

According to one embodiment, said coolant circulation duct is formed in the case.

According to one embodiment, the closure cover features a thickness of between 2 mm and 4 mm, notably equal to around 3.5 mm, and the coolant circulation duct features a cross section having an area approximately equal to 200 mm$^2$, in which the coolant is intended to circulate at a pressure of around 3.5 bar absolute and at a temperature of between −40° C. and +80° C.

According to one embodiment, the cooling circuit comprises a first portion and a second portion, said first and second portions of the cooling circuit complementing one another and being formed respectively in the case and in the closure cover, said first portion comprising at least one recessed part and said second portion comprising at least one projecting part, said recessed and projecting parts being configured to fit one inside the other so as to form stages of the cooling circuit which are situated at different levels arranged successively one after another along said cooling circuit.

According to one embodiment, said at least one recessed part and said at least one projecting part are configured to fit one inside the other by means of a functional clearance that allows said recessed and projecting parts to nest one inside the other.

PRESENTATION OF THE FIGURES

The invention will be better understood from reading the following description, given solely by way of example, and with reference to the attached drawings given by way of nonlimiting examples, in which identical references are given to similar objects and in which.

It should be noted that the figures set out the invention in detail so as to allow the invention to be implemented, it being of course possible for said figures to define the invention better if need be.

DETAILED DESCRIPTION OF THE INVENTION

Figure 1:
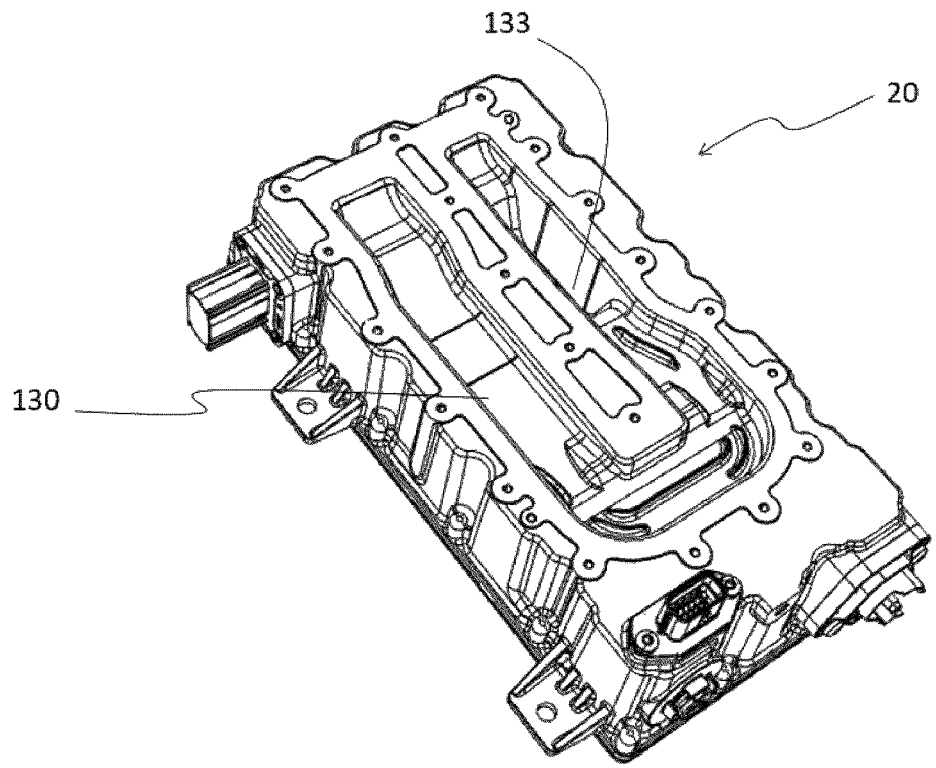
FIG. 1 is a schematic depiction of a case of an item of electrical equipment intended to receive a closure cover according to the invention.

FIG. 1 shows a case 20 of an item of electrical equipment, in which there is formed, in the form of a coolant circulation duct 130, a fluid-based cooling circuit 130. This case 20 is intended to accept a closure cover that closes the fluid-based cooling circuit 130.

Figure 2:
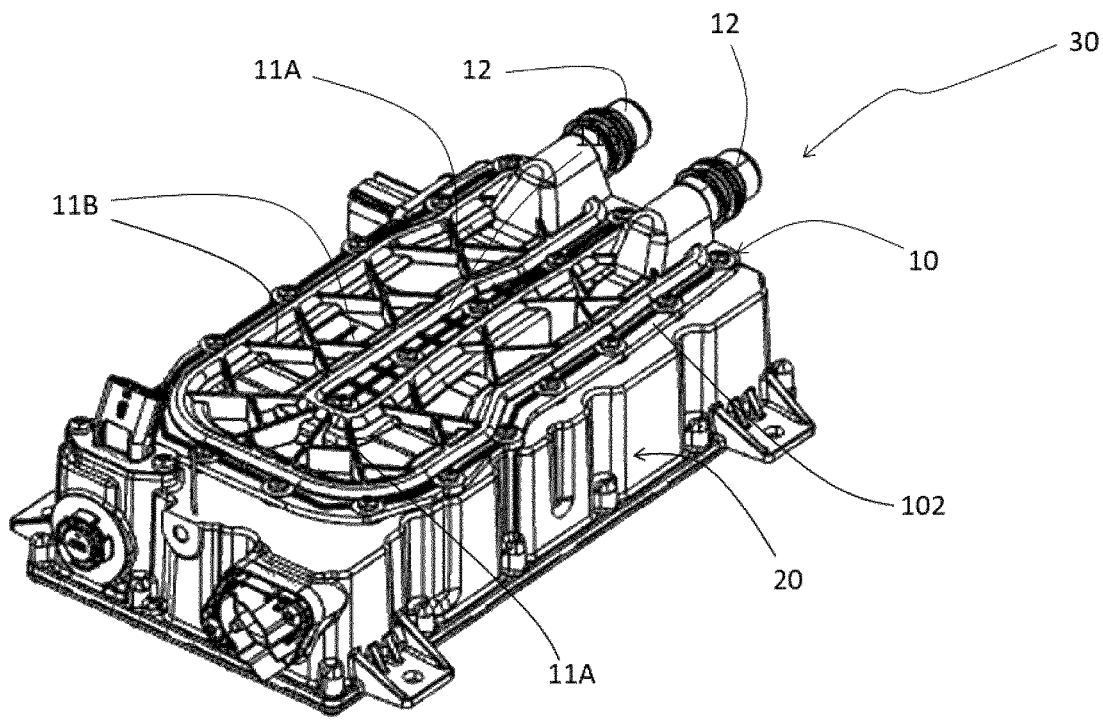
FIG. 2 is a schematic depiction of an item of electrical equipment formed of a case as depicted in FIG. 1 and of an example of a closure cover according to the invention.

FIG. 2 shows an item of electrical equipment 30, notably a DC/DC voltage converter or an inverter or an electric charger, for example for an electric or hybrid vehicle, comprising a case 2 as depicted in FIG. 1 and a closure cover 10 that closes the cooling circuit, according to one embodiment of the invention.

For the target applications, notably in the automotive field, with powers transferred by the electrical equipment concerned which are of the order of several kilowatts, and mechanical and environmental demands (temperature, pressure) which are those encountered in motor vehicles, it is known practice that the cases of such items of electrical equipment are made of aluminum, or possibly of cast iron.

Figure 3:
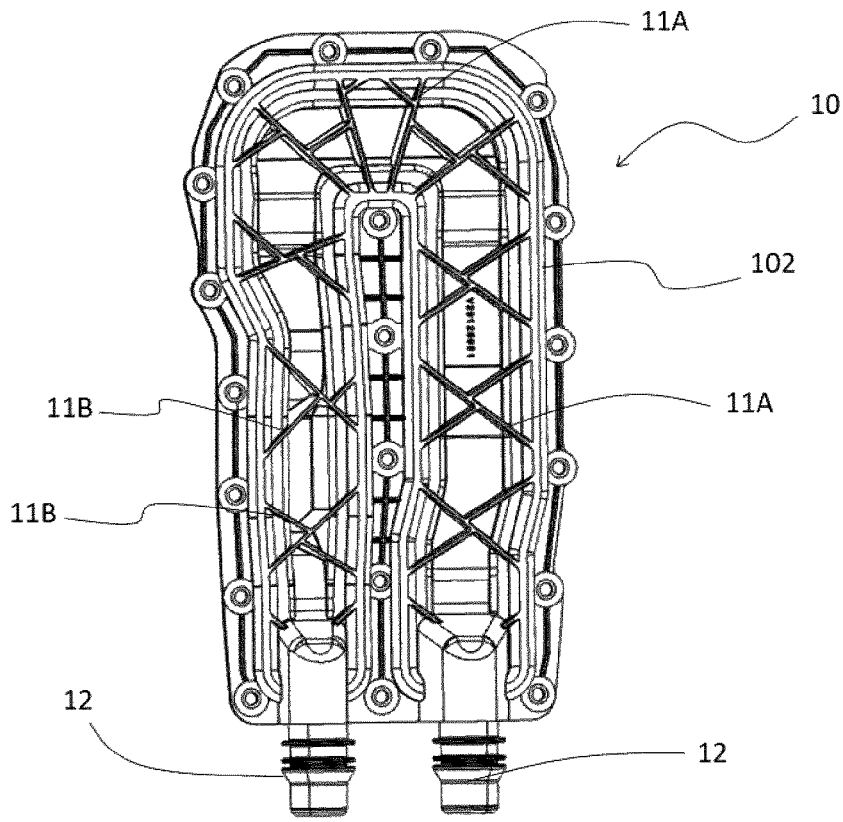
FIG. 3 is a schematic depiction of an example of a closure cover according to the invention, viewed by its opposite face to the coolant.
Figure 4:
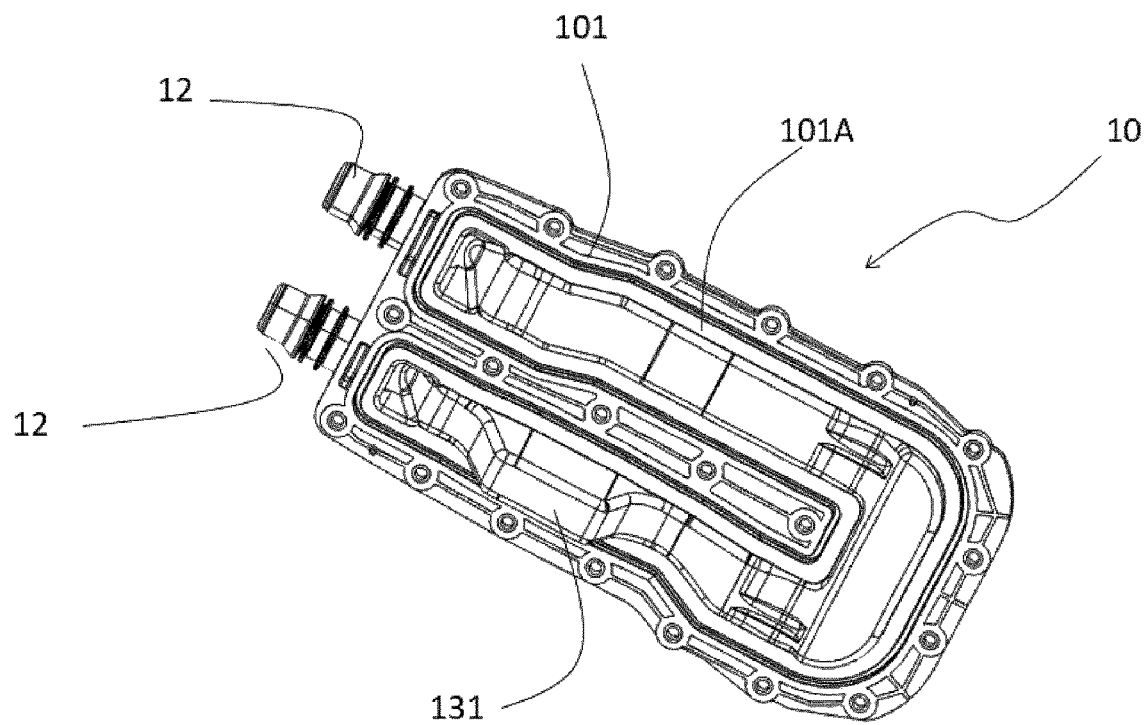
FIG. 4 is a schematic depiction of the same example of closure cover according to the invention, viewed via its coolant-side face.
Figure 5:
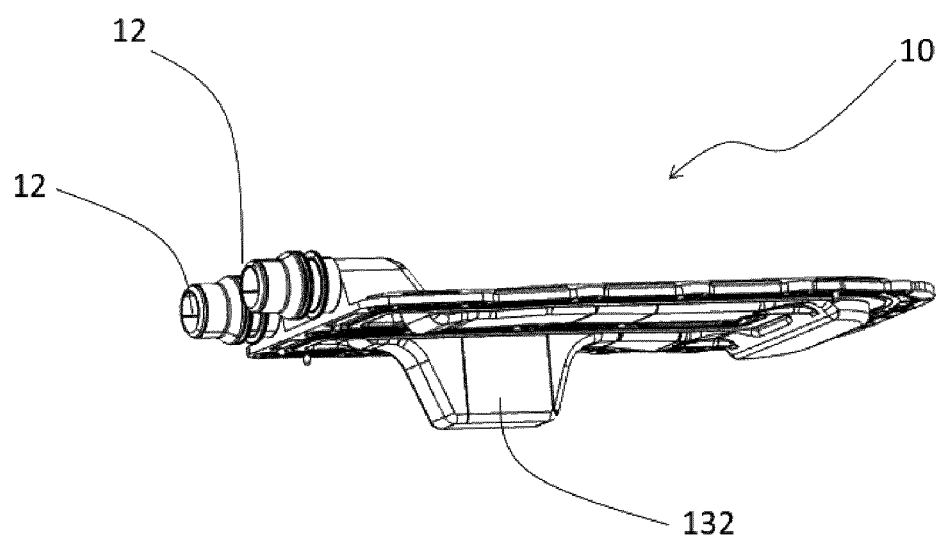
FIG. 5 is a schematic depiction of the same example of closure cover according to the invention, viewed in profile.

FIGS. 3 to 5 also show the closure cover 10 from different viewing angles.

Nonlimitingly, the description which follows relates in particular to the closure cover 10. According to the invention, said closure cover 10 is made of plastic, notably of PA66GF30, the case 20 being made of a different material, notably of aluminum for example. The plastic used for making the closure cover 10 is suitable for withstanding the mechanical and environmental demands (high or low temperatures, high pressure, chemical environment) expected notably in the context of use in high-voltage electrical equipment of an electric or hybrid vehicle. In particular, as a preference, the plastic used may be glass-fiber reinforced in order to enhance the mechanical integrity qualities thereof, the glass fibers acting as a physical binder. In particular, the closure cover 10 is made of plastic produced by injection molding.

The closure cover 10 features a coolant-side face 101, comprising a duct portion of the cooling circuit that forms the top 131 of the cooling circuit. The closure cover 10 has an opposite face 102 to the cooling circuit.

The opposite face 102 comprises an arrangement of reinforcing ribs 11A, 11B formed in the mass of the closure cover 10. The thickness of the closure cover 10 may be constant and notably correspond to the thickness of the material of which said closure cover 10 is made. In particular, the thickness of the closure cover 10 is defined as being the distance between the coolant-side face 101 and the opposite face 102 of the closure cover 10. In particular, the thickness of the closure cover 10 may be between 2 mm and 4 mm in order to withstand a pressure of the coolant circulating in the coolant circulation duct 130 ranging up to 3.5 bar absolute and a temperature of between −40° C. and +80° C. The thickness of the closure cover 10 may also be dependent on the geometry of the coolant circulation duct, namely on its cross-sectional area, which corresponds to the product of its width by its height.

The ribs 11A, 11B feature, for example, a height of between 2 mm and 30 mm and a width of between 0.3 times and 1 times the thickness of the closure cover 10, namely between around 1 mm and 3.5 mm in the case of a closure cover having a thickness of 3.5 mm.

The layout of the ribs 11A, 11B is designed to reinforce sensitive portions of the cooling circuit, notably parts at which a change in direction of the coolant occurs or extensive planar portions of the cooling circuit. The sizing and the layout of the ribs 11A, 11B are configured to avoid deformation of the cooling circuit, particularly under the pressure induced by the flow rate of coolant in said cooling circuit. The ribs 11A, 11B are designed to prevent deformation of cooling circuit portions in which coolant flows. The ribs 11A, 11B are thus designed to improve the mechanical strength of the closure cover 10 while at the same time maintaining, or even reducing, the mass thereof.

In particular, the ribs 11A, 11B may be positioned in such a way that portions of the closure cover 10 which are mechanically fixed to the case, on either side of the coolant circulation duct 130, are connected by first ribs 11A; furthermore, second ribs 11B, transverse to these first ribs 11A, connect said first ribs 11A to a border of the closure cover 10, on each side of said first ribs 11A, respectively, to limit the deformation of the coolant circulation duct 130.

The layout of the ribs 11A, 11B is thus configured to ensure that the coolant circulation duct 130 maintains its shape factor, even under highly demanding temperature and pressure conditions, notably under a pressure of around 3.5 bar absolute and under a temperature of the external surroundings of between −40° C. and +105° C.

In particular, the second ribs 11B and the first ribs 11A may make an angle of between 20° and 90° with one another.

Furthermore, the closure cover 10 is designed to close a cooling circuit of an item of electrical equipment, notably, for example, an inverter, a DC/DC converter or an electric charger for a motor vehicle. In the context, already mentioned hereinabove, of a voltage exceeding 400 V, or of a current strength that may reach 800 A, the coolant that circulates through the coolant circulation duct 130 has, for example, a pressure of 3.5 bar absolute and a temperature of between −40° C. and +150° C. In that case, in particular, the cross section of the coolant circulation duct 130 may feature a cross section of around 200 $mm^2$, which preferably remains constant. For example, the coolant circulation duct may feature a width of 31 mm and a height of 6.3 mm.

In this case, the thickness of the cover may be approximately equal to 3.5 mm, the thickness of the ribs, preferably between 0.3 times and 1 times the thickness of the closure cover 10, has a value of between 1 mm and 3.5 mm.

On the closure cover 10, the coolant-side face 101 also has a groove 101A for the fitting of a seal.

It should be noted that the use of a closure cover 10 made of plastic on a case 20 for an item of high-voltage electrical equipment, said case being made of aluminum, or even of cast iron, is counterintuitive for the person skilled in the art who would in theory consider it necessary to use a closure cover of the same material as the case in order notably to ensure sealing.

Specifically, if the case is made of aluminum then, in the prior art, a closure cover likewise made of aluminum is used as a preference. The use of one single material allows for example the use of a seal of the bonding sealant type, with the assurance that the sealant will bond correctly both on the case side and on the closure cover side. In the case of the invention, use is nevertheless made of a plastic that has a thermal expansion coefficient, within the target range of service temperatures, similar to that of aluminum, if the case is made of aluminum. Further, use is made of a seal capable of providing sealing between the distinct materials used, particularly aluminum on the one hand and a plastic of the PA66GF30 type on the other hand. It is specified that various types of seal may be used, notably a bonding sealant of the FIPG or CIPG type, a metal seal or a rubber seal, for example made of EPDM.

One advantage of the invention also lies in the fact that, according to one embodiment, corresponding to the one depicted in FIGS. 2 to 5, the spigots 12 are incorporated into the closure cover 10. Thus, said spigots 12 are, according to one preferred embodiment, formed in the mass of the cover 10, thus being molded, notably by plastic injection molding, at the same time as the closure cover 10 in its entirety, particularly in a single molding operation. Alternatively, the spigots 12 may be formed of end-pieces, notably made of metal, incorporated into the closure cover 10 by overmolding.

The incorporation of the spigots 12 into the closure cover 130 also makes it possible to ensure improved fluidity of the circulation of the coolant as it enters and leaves the cooling circuit via such spigots 12. As the circulation characteristics of the coolant are thereby improved, said circulation of coolant consumes less energy, which is to say it allows better thermal dissipation of the heat produced by the electrical components to be cooled.

The present invention makes it possible to reduce the number of operations of fitting an item of electrical equipment 30. Incorporating the spigots 12 into the closure cover 130 also improves the sealing of the electrical equipment 30.

Furthermore, incorporating the spigots 12 into the closure cover 10 makes it possible to reduce the number of machining operations to be performed on the case 20 because there is then no need to machine an orifice for accepting the spigots or else to perform surface grinding of the case to improve the surface finish in a region for accepting said spigots over a portion intended to receive a respective sealing gasket associated with said spigots. In the embodiment in which the spigots 12 are produced in the mass of the closure cover 130, during the one same molding operation, sealing is effectively designed in.

Furthermore, with reference to FIGS. 1 and 5 in particular, according to one example of the invention, the closure cover 130 is designed to close a "three dimensional" coolant circulation duct 130. Specifically, as already described, the case 20 and the closure cover 10 may be configured in such a way that said case 20 and the closure cover 10 comprise complementing cooling circuit portions. Said complementing portions comprise recessed parts 133 or projecting parts 132 such that the cooling circuit obtained by assembly may notably extend "three dimensionally". The cooling duct then comprises successive stages at different levels so as, for example, to cool electrical components which are themselves positioned in the case at different levels.

In FIG. 5, the closure cover 10 thus comprises a projecting part 132 and, in FIG. 1, the case 20 comprises a recessed part 133 forming a step in the cooling circuit, in other words a stage in the cooling circuit that is situated at a different level than the rest of the cooling circuit, so as to cool electrical components positioned at different levels in the case 20. Furthermore, said recessed parts 133 and projecting parts 132 nest inside one another thanks to a functioning clearance.

According to one embodiment, the closure cover 10 may further comprise at least one insert, notably a metal insert. In particular, said metal insert may be a plate acting as a heat sink and may be incorporated into said closure cover 10 by overmolding. The closure cover may comprise several such plates. Further, said metal insert may be at least one threaded hollow barrel intended to accept a fixing screw for fixing the closure cover 10.

The invention claimed is:

1. A single piece of molded plastic closure cover configured to close a coolant circulation duct portion of a fluid-based cooling circuit on a case for an item of electrical equipment of a motor vehicle, the closure cover comprises:
a coolant-side face comprising a complementary coolant circulation duct portion to the coolant circulation duct portion that forms a top of the fluid-based cooling circuit, wherein the complementary coolant circulation duct portion has a layout of recessed parts or projecting parts configured to nest inside a layout of recessed parts or projecting parts of the coolant circulation duct portion, and an opposite face to the coolant circulation duct portion, wherein the opposite face comprises an arrangement of ribs fixed on either side of the complementary coolant circulation duct portion and arranged in transverse along a cross-section of the complementary coolant circulation duct portion.

2. The closure cover as claimed in claim 1, said closure cover featuring a thickness which is defined as a function of ranges of values predefined respectively for a pressure and for a temperature of the coolant intended to circulate in the coolant circulation duct portion.

3. The closure cover as claimed in claim 1, wherein said ribs feature a thickness of between 0.3 times and 1 times a thickness of the closure cover.

4. The closure cover as claimed in claim 1, wherein portions of the closure cover is configured to be mechanically fixed to the case, on either side of the coolant circulation duct portion, are connected by first ribs, second ribs substantially transverse to said first ribs connecting said first ribs to a border of the closure cover on each side of said first ribs respectively.

5. The closure cover as claimed in claim 1, incorporating at least one coolant inlet and/or outlet fluid end-piece.

6. An item of electrical equipment comprising a DC/DC voltage converter, an inverter, or an electric charger, the item of electrical equipment comprising:

the case made of aluminum or of cast iron, within a mass of the coolant circulation duct portion forming the fluid-based cooling circuit; and the closure cover as claimed in claim 1.

7. The item of electrical equipment as claimed in claim 6, wherein the closure cover features a thickness equal to around 3.5 mm, and the coolant circulation duct portion features a cross section having an area approximately equal to 200 mm$^2$, in which the coolant is intended to circulate at a pressure of around 3.5 bar absolute and at a temperature of between −40° C. and +80° C.

8. The item of electrical equipment as claimed in claim 6, wherein the fluid-based cooling circuit comprises a first portion and a second portion, said first and second portions of the fluid-based cooling circuit complementing one another and being formed respectively in the case and in the closure cover, said first portion comprising at least one recessed part and said second portion comprising at least one projecting part, said recessed and projecting parts being configured to fit one inside another so as to form stages of the fluid-based cooling circuit which are situated at different levels arranged successively one after another along said fluid-based cooling circuit.

9. The closure as claimed in claim 1, wherein the fluid-based cooling circuit formed by closing the coolant circulation duct portion with the closure cover traverses three substantially non-coplanar directions.

10. The closure as claimed in claim 6, wherein the fluid-based cooling circuit formed within the case traverses three substantially non-coplanar directions.

* * * * *